United States Patent
Baxter et al.

(10) Patent No.: US 7,397,039 B2
(45) Date of Patent: Jul. 8, 2008

(54) REAL-TIME COMPENSATION OF MECHANICAL POSITION ERROR IN PATTERN GENERATION OR IMAGING APPLICATIONS

(75) Inventors: Bruce B. Baxter, San Mateo, CA (US); Benyamin Buller, Cupertino, CA (US); Wenwei Qiao, San Jose, CA (US); Huei-Mei Kao, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 92 days.

(21) Appl. No.: 11/241,794

(22) Filed: Sep. 30, 2005

(65) Prior Publication Data

US 2007/0085027 A1    Apr. 19, 2007

(51) Int. Cl.
*G01B 11/02* (2006.01)
(52) U.S. Cl. .................. 250/400; 356/500; 356/508; 356/349; 356/351; 356/358; 356/363; 356/400; 356/401; 356/498; 355/53; 33/1

(58) Field of Classification Search ......... 356/450–521, 356/349, 351, 358, 363, 400, 401; 250/400; 355/53; 33/1
See application file for complete search history.

(56) References Cited

U.S. PATENT DOCUMENTS

| 5,801,832 | A | * | 9/1998 | Van Den Brink | ............. 356/500 |
| 6,160,628 | A | * | 12/2000 | Inoue | ......................... 356/500 |
| 2007/0076216 | A1 | * | 4/2007 | Eckes et al. | ................. 356/498 |

* cited by examiner

*Primary Examiner*—Jack I. Berman
*Assistant Examiner*—Meenakshi S Sahu
(74) *Attorney, Agent, or Firm*—Patterson & Sheridan LLP (57) ABSTRACT

Improved systems, apparatus, and methods for detecting positions of moving stages and accurately compensating position error during operation (in "real time") are provided. For some embodiments, rather than rely on two dimensional position measurements, measurements in at least three dimensions may be taken allowing compensation for pitch and roll and, therefore, more accurate position measurements. Further, by including a measurement of a beam column, compensation for movement of the beam may be performed.

20 Claims, 5 Drawing Sheets

REAL-TIME COMPENSATION OF MECHANICAL POSITION ERROR IN PATTERN GENERATION OR IMAGING APPLICATIONS

FIELD OF THE INVENTION

The present invention relates to a detection method and a detection device for detecting positions of positioning systems for stages, such as those utilized in charged particle beam inspection and pattern writing systems.

BACKGROUND OF THE INVENTION

In charged particle beam (CPB) systems, specimens or "workpieces" are retained on movable stages for positioning relative to the beam. Charged particle beam systems are used in a plurality of industrial fields, including, but not limited to, testing systems, imaging systems like scanning electron microscopes (SEMs), inspection systems for semiconductor devices, and exposure systems for pattern writing via lithography.

There is a high demand for structuring, testing and inspecting specimens within the micrometer and nanometer scale. Micrometer and nanometer scale process control, inspection or structuring is often done with charged particle beams, e.g. electron beams. Charged particle beams offer superior spatial resolution compared to, e.g. photon beams, due to their short wavelengths. However, there are also light optical systems with a stage that supports a specimen and the stage being movable to position the specimen with a precision of 50 nm or better.

Generally, as the precision of measurement, testing, or patterning systems increases there is a demand for high precision and fast positioning of specimen in those system. The stage holding the specimen is typically independently movable in x-direction and y-direction. In conventional systems, positioning data of the stage is measured in two perpendicular axes (e.g., X and Y axes). The electron beam of the e-beam inspection tool is deflected by a vector opposite to that of the measured error in position.

Unfortunately, prior art systems typically assume a negligible effect of pitch and roll and assume a fixed primary beam with respect to the plane of interest. However, in practice, the effects of pitch and roll may be significant and result in significant positional errors. Further various sources may also cause movement of the primary beam, which may also result in significant positional error.

Accordingly, what is needed is improved systems for detecting positions of moving stages and accurately compensating position error during operation (in "real time").

SUMMARY OF THE INVENTION

Improved systems, apparatus, and methods for detecting positions of moving stages and accurately compensating position error during operation (in "real time") are provided.

Method steps may be performed by way of hardware components, a computer programmed by appropriate software, by any combination of the two or in any other manner. Furthermore, aspects are also directed to methods by which the described apparatus operates. It includes method steps for carrying out every function of the apparatus or manufacturing every part of the apparatus.

Although some of the prior art and systems including the present invention will be described in the following with reference to charged particle beam (e.g., electron and ion beams) inspection and pattern writing systems, it should be understood that the aspects described herein may be made to correct positional errors in a variety of other applications involving a moving specimen.

BRIEF DESCRIPTION OF THE DRAWINGS

Some of the above indicated and other more detailed aspects of the invention, will be described in the following description and partially illustrated with reference to the figures. Therein:

FIG. 2b shows another side view of the embodiment of FIG. 2a;

DETAILED DESCRIPTION OF THE DRAWINGS

For some embodiments, rather than rely on two dimensional position measurements, measurements in at least three dimensions may be taken allowing compensation for pitch and roll and, therefore, more accurate position measurements. Further, by including a measurement of a beam column, compensation for movement of the beam may be performed.

It should be understood from the above description of the present invention that the interferometer systems shown herein are capable of a detailed analysis of the position and/or orientation of a specimen retaining stage. The system provides high accuracy and low sensitivity to thermal expansion and either mechanical influences. The system is further capable of flexibly correcting for further disturbances.

The process of writing patterns or forming an image is subject to a number of error sources. Generally, systems including a stage with a x/y motion system are sensitive to static and dynamic positioning errors. In systems where the pitch and roll characteristic of the motion system produce errors larger than the desired positioning precision, and in system where relative influences between the beam origin, for example a column, and the sample become relevant, prior art approaches have to be improved. Electronic compensation mechanisms are typically required to reduce the effects of positioning (movement to a desired position) errors and external disturbances for high fidelity pattern writing and imaging systems.

An Exemplary System

Figure 1:
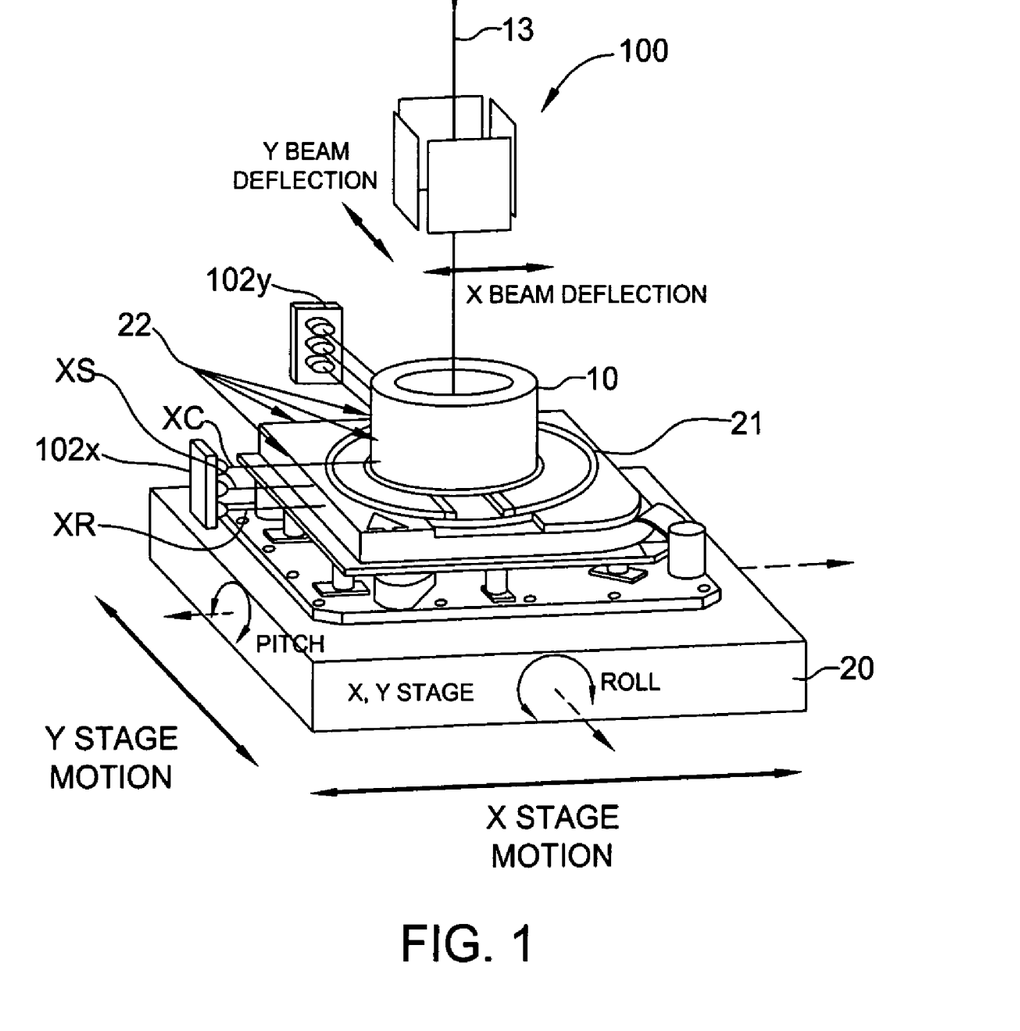
FIG. 1 shows a diagram of a charged particle system and a multiple axes interferometer system illustrating the physical positioning and usage of six measurement axes.

A first embodiment of the present invention will now be described with respect to FIG. 1. FIG. 1 is a system diagram of a charged particle beam system including the optical components of a laser interferometer position monitoring system. FIG. 1 shows the base of a column 10 of a testing device directing e.g. an electron beam 13 on a specimen 21 retained on stage 20.

Generally, the stage is movable in at least two directions (e.g., perpendicular X and Y directions) in order to allow the system to direct the beam on all areas of the specimen. However, the movement of the stage may introduce misalignments whereby the beam hits the specimen at a position that is at least slightly different than the desired (or target) position. Additionally, within high precision systems, wherein writing or measuring require a specimen positioning precision better than 50 nm, thermal effects generating a drift between electron beam 13 and specimen 21 must be compensated for. For these reasons, a correction mechanism compensating misalignments of stage 20 with respect to column 10 may be provided.

Further, it is possible that either column 10 or stage 20 may be prone to vibrations, which may also result in a positioning errors of the stage with respect to the column. Accordingly, a system measuring the position of the stage relative to the column is desirable. Finally, imperfections in the mounting and/or surface of interferometer mirrors, as well as non-uniform DC magnetic fields may further influence the beam-to-target offset measurement.

As illustrated, in order to provide position data in both X and Y directions, two monolithic beam splitter blocks 102x and 102y may be provided. For some embodiments, within each of the beam splitter blocks, three interferometric axes are generated. Thereby, for each axis, a measurement beam path is directed to a reflection element at stage 20 or column 10, respectively. The reflected measurement beam is superposed (or interferes) with an internal reference beam, thereby creating an interferometric signal, with the amount of interference depending on the relative length of the reference and measurement paths. Illustratively, the monolithic beam splitter block 102x provides interferometric signals to measure three distances $X_c$, $X_s$ and $X_R$.

Depending on the particular embodiment, the interferometric signal may be guided from the interferometer to a optical-digital converter with an optical fiber and/or with other optical elements, such as lenses or mirrors.

The first interferometric signal for the distance $X_c$ allows to extract positional data of column 10. This data can be used to track positional changes of column 10. Within FIG. 1, for both directions (x and y) two additional distances are measured. Each of these interferometric optical components provide a measurement beam path. The respective measurement beam paths are directed onto mirror 22 attached to stage 20. Thus, two further interferometric signals can be provided to detectors measuring intensity variations occurring due to constructive or destructive interference between signals traversing the reference and measurement paths.

Pitch and Roll Position Measurements

Figure 2A:
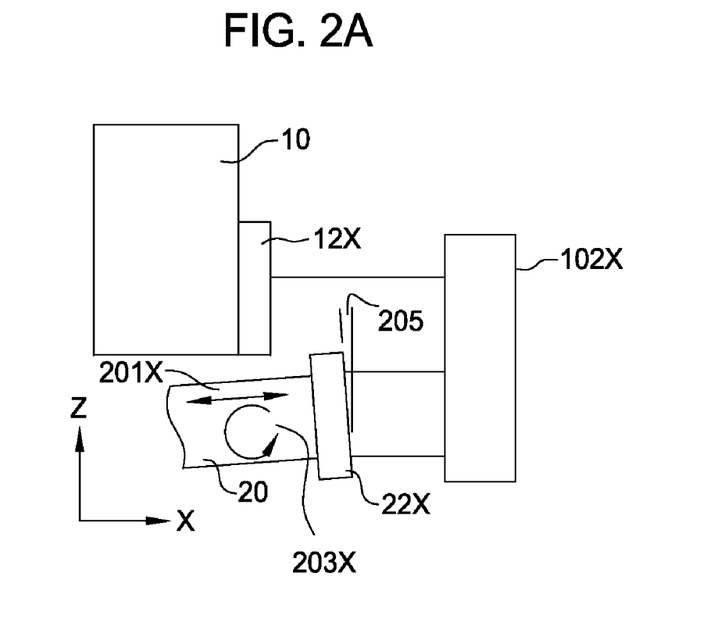
FIG. 2a shows a schematic drawing of three interferometer axes in a side view to explain the obtainable measurement results.
Figure 2B:
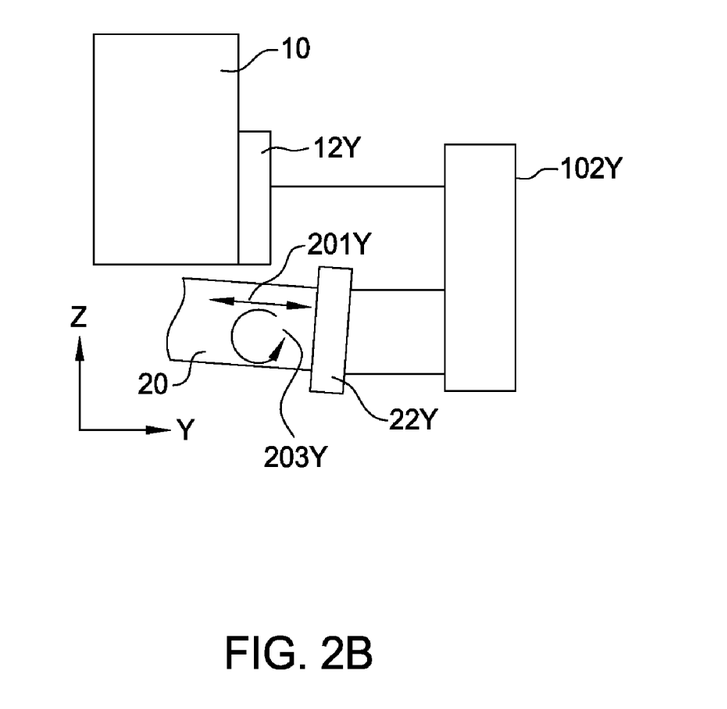

The multi-axes laser interferometer system of FIG. 1, for x-direction and y-direction, includes three interferometers and has the ability to extract positional data from each of the three axes independently. Some of the possible calculations of the computing system 120 will now be described with respect to FIGS. 2a and 2b. FIG. 2a shows a multi-axes laser interferometer system relative to a z-x-plane, while FIG. 2b shows a similar multi-axes laser interferometer system relative to a z-y-plane. As such, components in FIG. 2a may be designated with reference numbers having a subscript "x", while similar components in FIG. 2b may be designated with similar reference numbers having a subscript "y".

Referring first to FIG. 2a, first interferometric optical components included in the monolithic beam splitter block 102x, measures a distance to mirror 12x. Mirror 12x is fixed to column 10. Therefore, this distance is indicative of the position of the column in the x-direction. Second interferometric optical components included in the monolithic beam splitter block 102x, measures a first distance to mirror 22x. Thereby, a distance indicative of the position of the stage in x-direction is measured. These two axes enable the system to measure the above-described two distances and the difference of these two distances, which provides a relative position of the stage with respect to the column.

Making use of these two axes, the following information can be obtained. First, the difference of the two distances, that is the relative position of the stage with respect to the column, can be used for example to measure a new position of the stage as indicated by arrow 201x. Misalignments of the stage when moving to a new position may also be taken into account. Further, different behaviors of the column and the stage in view of thermal expansion, which may result in a drift of the relative position, can be measured.

In addition, vibrations of the column and the stage may be detected independently. Vibrations of the column and the stage may be introduced in the system by acoustic noise or other components, like vacuum pumps or the like. As a result of these different sources of vibration, different vibration modes occur. Measuring the distance of each axis independently, enables the system to measure the movements of the respective mirrors and, thus, enables detection of mechanical oscillations between the beam origin and the sample.

Third interferometric optical components included in the monolithic beam splitter block 102x are also provided to measure another distance of mirror 22x. An optical signal processing (computing) components provided as part of the system may average the distance values obtained from the measurement of the second and the third interferometric optical components included in the monolithic beam splitter block 102x. Further, such processing components may calculate a rotation of the stage as indicated by arrow 203x. The rotation shown in the view of the z-x-plane, that is a rotation around a y-directional axis, is generally referred to as pitch.

The rotation by angle 205 may, on the one hand, influence the distance of the stage with respect to the column. On the other hand, positioning errors in the x-y-plane may also be introduced.

As mentioned above, FIG. 2b is a side view showing the y-z-plane. To measure movements, misalignments, vibrations or drifts, as indicated by arrow 201y, as well as rotations, as indicated by arrow 203y, additionally, monolithic beam splitter block 102y for measuring three distances in y-direction is provided. The rotation shown in the view of the y-z-plane, that is a rotation around an x-directional axis, is generally referred to as roll.

As shown in FIGS. 2a and 2b, each direction (x and y) is measured with three interferometers, which are vertically aligned. Thus, the system for measuring along the x-direction and along the y-direction includes six interferometers, that is six interferometric optical components, each with a measurement path and a reference path.

Generally, for the embodiments described herein, distance values are measured by interferometers. In the illustrated embodiments, three distances are measured by a laser beam divided into three interferometer axes in a monolithic beam splitter block. Each axis of the multi-axes laser interferometer system may be measured and converted to a digital signal. The individual signals may be differentiated digitally.

Returning now to FIG. 1, the stage 20 may be moved in X and Y directions. During movement triggered by a stage servo controller, specimen 21 is newly positioned. For reasons described above, the absolute position of the stage may be different than the target position. Additionally, relative movements of column 10 with respect to the specimen 20 introduced by vibrations or drift may disturb the beam-to-target positioning. The interferometric optical components shown in FIG. 1 provide three distance values related to x-positioning and three distance values related to y-positioning. As these values are evaluated, real-time positional error vectors may be calculated and used to compensate for the relative position of the column and the stage in X and Y directions, as well as for pitch and/or roll.

Since the specimen position is fixed with respect to the stage and the electron beam position is known with respect to the column, these results can be transferred to relative positions between the electron beam and the specimen. The difference between the measured relative positions and pitch/roll and the desired (target) coordinates of the electron beam on the specimen may be calculated and used to generate a compensation vector. The compensation vector may be provided to the stage servo controller for optimization of the stage control. In addition, or as an alternative, the compensation vector may be transformed to analog signals to control electrostatic deflection quadrupole 100. As is known, quadrupole 100 may be controlled to deflect the electron beam to compensate according to the compensation vector in a real-time manner.

Figure 3:
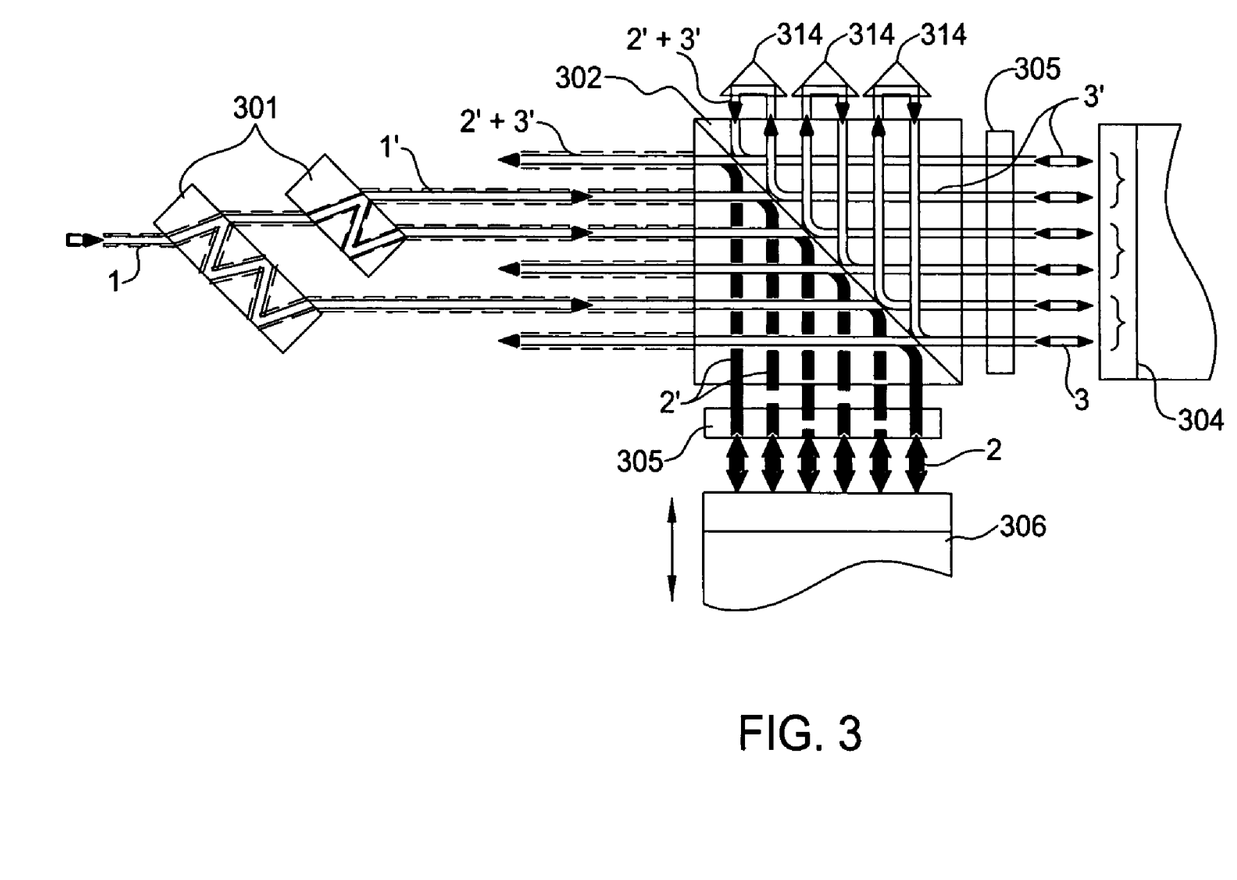
FIG. 3 shows one embodiment of the ray paths of three interferometric axes generated by a monolithic beam splitter assembly.

Next, an exemplary arrangement of interferometric optical components suitable for multi-axis measurements in accordance with one embodiment of the present embodiment will be described with respect to FIG. 3. As illustrated, beam splitting elements 301 split the incoming laser beam 1 into three laser beams. The three laser beams are divided into three measurement beams 2 and three reference beams 3 within the monolithic beam splitter block 302. Beam splitter block 302 may be provided in the form of a beam splitting cube.

In the following, the beam path of the reference beam and the measurement beam will be explained by the top one of the three laser beams indicated as 1'. A part of the laser beam travels straight through beam splitter cube 302. Thereby, reference beam 3' is formed. The reference beam is reflected by reference mirror 304. In view of the fact that the beam travels through quarter-wave plate 305, reference beam 3' is next redirected by beam splitter cube 302 towards corner reflector 314. For some embodiments, corner reflector 314 may be a retroreflector. The beam 3' after being reflected by corner reflector 314 is then again reflected by beam splitter cube 302 towards reference mirror 304. Since the twice reflected reference beam 3' travel through quarter-wave plate four times, reference beam 3' travels straight through the beam splitter cube 302 and leaves the beam splitter on the left-hand side.

Another part of the incoming laser beam 1' is reflected by beam splitter cube 302 when entering the beam splitter. This part of the beam forms the measurement beam path 2'. Measurement beam 2' is reflected by measurement mirror 306. Since the measurement beam passes through quarter-wave plate 305, the reflected measurement beam travels straight through the beam splitting cube 302 and is reflected by corner reflector 314. Next, the measurement beam passes against rate through cube 302 and is reflected a second time by measurement mirror 306. Since the twice reflected measurement beam 2' travel through quarter-wave plate four times, measurement beam 2' travels straight through the beam splitter cube 302 and leaves the beam splitter on the left-hand side. Both, the measurement beam and the reference beam superimpose when leaving the beam splitter cube on the left-hand side and form the interferometric signal 2'+3'.

Figure 4:
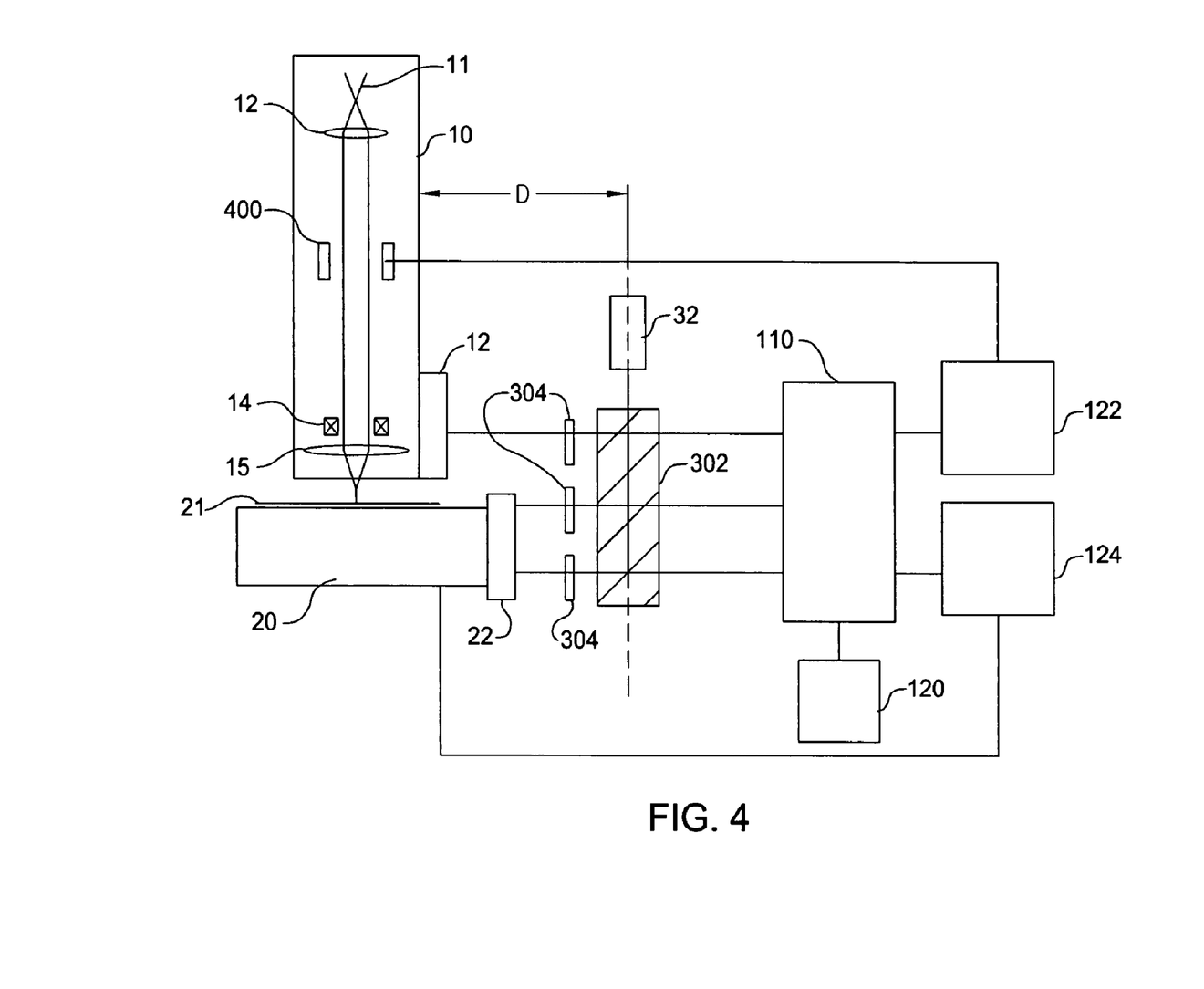
FIG. 4 shows a schematic drawing of a charged particle device and an embodiment of an interferometer system.

FIG. 4 shows a charged particle beam system utilizing a multi-axes interferometer positioning system, in accordance with one embodiment of the present invention. The charged particle beam system includes a charged particle beam source 11, such as an electron source. A charged particle beam is directed through column 10 by condenser lens 12, deflector system 400, scanning unit 14 and objective lens 15. Other commonly used elements for guiding, forming, imaging or measuring a charged particle beam may also be included. Objective lens 15 focuses the electron beam on specimen 21. Scanning unit 14 deflects the electron beam in a scanning pattern over the specimen. Thereby, secondary and/or backscattered electrons are released upon impingement of the charged particle beam from different measurement locations on the specimen. The secondary and/or backscattered electrons can be detected for testing and/or inspection purposes. Alternatively, the charged particle beam may be utilized for writing a pattern on the specimen.

Compensation of Mechanical Position Error

In either case, in order to obtain a high resolution (in the image or written pattern), it is desirable to precisely position specimen 21 with respect to the electron beam and, thus, with respect to the beam column 10. Because the specimen 21 may be moved by moving the supporting stage 20, the resolution may be substantially improved if misalignments, drifts and/or vibrations of the stage 20 with respect to the column 10 are taken into account.

In order to measure the position and the orientation of stage 20, and specimen 21 respectively, with respect to the column 10, a laser interferometer system is provided. FIG. 4 shows a laser beam system with a laser beam source 32. The laser beam is directed to monolithic beam splitter block 302. The beam splitter block directs three measurement beam paths towards the column or the stage, respectively. The beam splitter block 302 is symbolized in FIG. 4. It should be understood that a beam splitter block as for example shown in FIG. 3 or other optical monolithic configurations providing three measurement beam path and three reference beam path may be used. Depending on the particular embodiment, the laser beams may be directed to the interferometric optical components, by lens optics, fiber optics or a combination therefrom.

The laser beams directed towards the column 10 or the stage 20 are each partly reflected by the plane reference surface 304. Thereby, a reference beam is formed for each axis. The rest of each of the laser beams is reflected at corresponding measurement points on mirrors 12 and 22, respectively. Accordingly, the measurement beams are provided. Mirror 12, which is attached to column 10, reflects one of the measurement beams. Mirror 22, which is attached to the stage 20, reflects the other two measurement beams.

The three measurement beams superimpose with the corresponding reference beams to form interferometric signals, which are transferred to an optical-digital converter of a processing system 110. The interferometric signals may be directed to the processing system 110 by lens optics, fiber optics or a combination therefrom. Within this processing system 110, detectors are provided for measuring the intensity variations of each of the three independent interferometric signals. As explained above, the intensity variations result from constructive or destructive interference of each of the three measurement beams with the corresponding one of the reference beams, which depends on the relative length of the reference and measurement paths. Consequently, three digitized values indicative of a distance from a mirror 12,22 to the monolithic beam splitter block are generated.

As shown in FIG. 4, beam splitter block 304 may be mounted on a support. As will be understood by a person skilled in the art, if the support moves because of thermal expansion or the like distance D changes. Thermal expansion of the beam splitter block itself may also result in a change in the distance D. In any case, all three distances measured by the three interferometers will experience the same variation of distance D. Consequently, the interferometer distance measurements are inherently insensitive to thermal expansion. Since all three beam paths will expand or contract simultaneously, any error in measurement associated with thermal expansion will be canceled in the final calculation of position.

Computing system 120, which may be connected to processing system 110 or may be included in evaluation system 110, may then calculate any of the values described above with respect to FIGS. 2a and 2b, based on the digital signals provided.

FIG. 4 shows three independent interferometers provided by a monolithic beam splitter block. These interferometers are used to measure distances along one direction, for example the x-direction. If it is desirable to provide the same measurements in the y-direction, another three independent interferometers provided by another monolithic beam splitter block need to be provided. Therefore, a laser interferometer system, capable of measuring along a first direction includes three independent interferometric optical components. The laser interferometer system, capable of measuring along a first direction and along a second direction includes six independent interferometric optical components. For simplicity reasons, FIG. 4 only shows the interferometric optical components for measuring along the first direction.

Within FIG. 4, the evaluation system 110 and the computing system 120 can generate values corresponding to the relative position of the stage 20 with respect to the column, values for the orientation of the stage (pitch and/or roll) and values corresponding to vibrations of the stage and/or the column. One of these values or a combination of these values is used for compensating for a mispositioning of the stage relative to the charged particle beam within column 10. Compensation may be conducted by means of beam controller 122 or stage controller 124.

Beam controller 122 is connected to deflector system 400. Deflector system 400 may include electrostatic, magnetic or combined magnetic-electrostatic deflectors to deflect the charged particle beam. Typically, an electrostatic quadrupole may be utilized. Thereby, deflection in x-direction and/or y-direction can be obtained. Thus, it is possible to compensate for an undesirable variation of the position of the charged particle beam with respect to the specimen.

Additionally, compensation may be obtained with stage controller 124, which controls the movement of stage 20. Thus, undesirable mispositionings of the stage 20 relative to the charged particle beam may be compensated for by controlled movement of stage 20 by stage controller 124 in response to positional error signals generated based on the interferometric position measurements.

Figure 5:
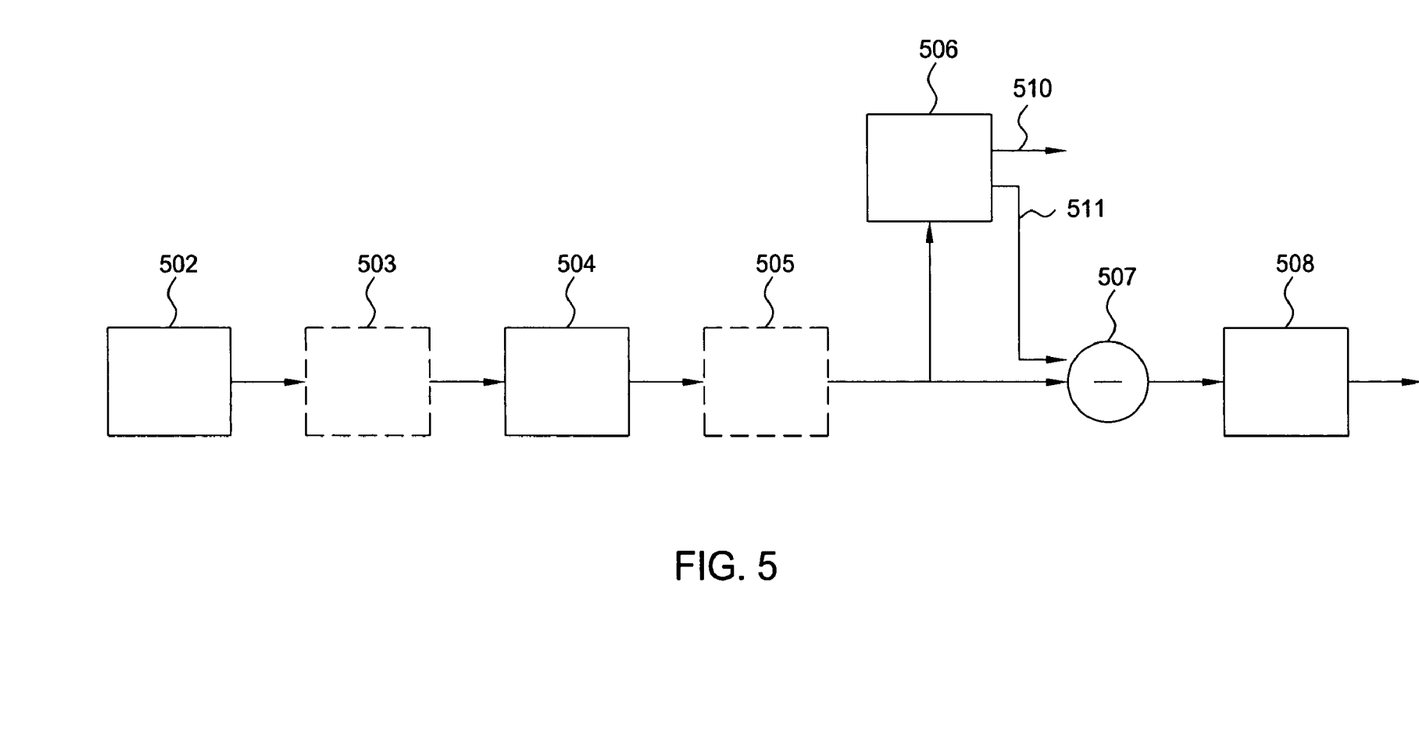
FIG. 5 shows a flow chart explaining embodiments of measuring positional data.

FIG. 5 shows a flowchart of exemplary operations for measuring positional data of the stage and transforming the positional data for compensation, in accordance with one embodiment of the present invention. At step 502, the positional data is measured with the interferometers. As described above, for both X and Y directions, three interferometric measurement beams are directed along the respective direction. For each direction, one measurement beam is directed onto a mirror at the column and two measurement beams of directed onto a mirror at the stage. The three measurement beams are directed along the respective direction with a monolithic beam splitter block.

Three distances are measured for each direction in a real-time manner. This results in six positional data values and six velocity data values. As an example, within the present application, real-time is considered to measure all six positional data values and all six velocity data values each with a frequency between 500 and 1000 kHz, e.g. 600 kHz.

In view of the fact that two measurement beams are directed onto the stage for each direction, pitch and roll measurements can be taken into account for the calculations of compensation vectors described below. Further, mechanical motion of the beam origin of the pattern writing or image forming system, that is for example an electron column, may be included in the calculation of compensation vectors, because of the third measurement beam per axis. Thereby, the instantaneous position of the beam origin as a reference position for each direction can be taken into account. The consideration of the beam origin position in combination with the usage of a monolithic beam splitter block further results in an insensitivity to thermal expansion. The above-mentioned features result in a higher accuracy of dynamic mechanical error compensation.

At step 504, real-time calculations of the instantaneous position of the electron beam relative to the specimen, that is the actual x/y specimen positioning with respect to the beam, are conducted for x-direction and for y-direction. In other words, for dynamically compensating position errors in a charged particle pattern generation or imaging system in a real-time manner the above-mentioned six positional data values and six velocity data values need to be further converted. These conversions may take into account the measured positional data of the column and the roll/pitch of the stage. Since the vertical distances of the three interferometric measurement beam paths are known for each direction, the actual positions can be calculated.

At step 503, before the real-time calculation of the actual positions, the six positional data values and the six velocity data values may be generated. As indicated by the dashed lines, step 503 may be optional. As an example, within step 503 the positional data values may be subject to mirror curvature corrections in order to correct for undesired influences of the interferometric mirror surfaces. Additionally or alternatively, the velocity data values may be transformed to positional compensation values. The positional compensation values are based on the velocities measured by the six interferometric signals, thereby taking into account and interpolation between two positional sets of data values by the measured set of velocities values. Further, the data age may be compensated for.

Taking into account the optional step 503, the real-time X/Y calculation of step 504 can either be conducted based on the original data values, based on the mirror curvature corrected positional values, based on the velocity compensated positional values, or based on the mirror curvature corrected and velocity compensated positional values.

At step 506, the parameters for scanning the electron beam over the specimen are transformed to control signals 510 for control of the scanning unit and stage movement. Further, for each instant of time a desired projected position is generated. As indicated by arrow 511 the desired X/Y position and the real-time observed position from step 504 also subtracted in step 507 to generate an error measurement, as a raw compensation vector.

According to one embodiment, wherein the stage is in a static mode, the desired X/Y position is generally based on the scanning of the electron beam with a scanning unit. Typically, for a charged particle beam column, without being limiting to the invention, scanning is conducted by sweeping the electron beam over the specimen and retracing the charged particle beam. As one example, the output of the correction may be updated, if desired, on each retrace. According to another embodiment, for a non-static stage, instantaneous stage position, stage velocity and desired state position. Generally, the specimen is scanned by moving the stage in one direction (for example x-direction) and sweeping the beam in the other direction (for example y-direction). A velocity profile generator may constantly calculate new desired positions based on a velocity, a starting point and the time at which the measurement is being taken. Thus, these new values of the desired position may be used for the subtraction with the real-time measured position to generate the error vector.

Before step 507, subtraction means for correcting static beam-to-target measurement distortions may be applied in step 505. As indicated by the dashed lines, this step is optional. In step 505 a mapping correction taking into account magnetic fields, mirror defects, or the like is conducted. The real-time calculated X/Y position of step 504 is used as an index into a two-dimensional distortion map. The resulting indexed correction vector may be combined with the raw compensation vector to form a final compensation vector.

At step 508, the final compensation vector is transformed into the beam deflection coordinate system to form the beam error function. Typically, the above-mentioned steps are calculated digitally. Finally, the beam error function is converted to analog signals, which can be provided for the electron beam deflection in x-direction and in y-direction. Before feeding the analog signals to the deflection system (see e.g. electrostatic quadrupole 100 in FIG. 1) the analog signals may be low pass filtered to remove noise at frequencies above the frequencies of typical mechanical vibrations. Further, appropriate amplification of the analog signals can be provided. The analog signals may either be deflection voltages for electrostatic beam deflectors or deflection currents for magnetic deflectors. In the event combined magnetic/electrostatic deflectors are used voltages and currents will be generated.

Having thus described the invention in detail, it should be apparent for a person skilled in the art that various modifications can be made in the present invention without departing from the spirit and scope of the following claims.

What is claimed is:

1. An apparatus for detecting a position of a movable stage, comprising:
   first interferometers for taking at least three measurements along at least three different axes, wherein at least one measurement along a first axis indicates a distance to a column, and at least two of the measurements along second and third axes indicate distances to different positions on the movable stage and wherein the first axis and the second and third axes are substantially parallel and coplanar, the first interferometers using a first beam splitter block; and
   logic for calculating a relative distance between the movable stage and the column based on the at least three measurements.

2. The apparatus of claim 1, wherein the logic is configured to calculate a parameter of the movable stage based on the at least two of the measurements along the second and third axes.

3. The apparatus of claim 2, wherein the parameter is pitch or roll of the movable stage.

4. The apparatus of claim 2, wherein the logic is configured to correct the calculated relative distance between the movable stage and the column, the parameter of the movable stage based on undesired influences of mirrors of the first interferometers, or both.

5. The apparatus of claim 2, further comprising a stage controller coupled to the logic for moving the stage in response to the calculated relative distance between the movable stage and the column or the parameter of the movable stage based on the at least two of the measurements along the second and third axes.

6. The apparatus of claim 1, further comprising a deflection controller coupled to the logic for deflecting a beam of the column in response to the calculated relative distance between the movable stage and the column.

7. The apparatus of claim 1, further comprising second interferometers for taking at least three measurements along at least three different axes, wherein at least one measurement along a fourth axis indicates a distance to the column, and at least two of the measurements along fifth and sixth axes indicate distances to different positions on the movable stage and wherein the fourth axis and the fifth and sixth axes are substantially parallel and coplanar, the second interferometers using a second beam splitter block.

8. The apparatus of claim 7, wherein the fourth axis is substantially perpendicular to the first axis.

9. The apparatus of claim 1, wherein the logic is configured to calculate a compensation vector in real-time based on at least the calculated relative distance between the movable stage and the column.

10. The apparatus of claim 1, wherein the logic is configured to calculate a value corresponding to vibrations of the movable stage and/or the column.

11. A method for compensating for a positional error of a movable stage, comprising:
    detecting a distance from a first interferometer to a column along a first axis;
    detecting distances from at least second and third independent interferometers to different locations on the movable stage along second and third axes, wherein the first axis and the second and third axes are substantially parallel and coplanar and the first, second, and third interferometers share a first beam splitter block;
    calculating a relative distance between at least one of the locations on the movable stage and the column or a parameter related to the relative distance between the different locations on the movable stage based on the detected distances; and
    adjusting the position of the movable stage or a beam of the column based on the calculation.

12. The method of claim 11, wherein adjusting the position of the beam comprises deflecting the beam using electrostatic or magnetic beam deflectors disposed in the column.

13. The method of claim 11, wherein adjusting the position of the movable stage or the beam comprises moving the movable stage or deflecting the beam an adjustment distance in a direction substantially parallel to the first axis and the second and third axes based on the calculation.

14. The method of claim 11, wherein adjusting the position of the moveable stage or the beam comprises comparing the calculation to a desired position for the column or the movable stage.

15. The method of claim 11, further comprising calculating a value corresponding to vibrations of the movable stage, the column, or both based on the detected distances.

16. The method of claim 11, further comprising:
    detecting a distance from a fourth interferometer to the column along a fourth axis intersecting the first axis; and detecting distances from at least fifth and sixth interferometers to different locations on the movable stage along fifth and sixth axes, wherein the fourth axis and the fifth and sixth axes are substantially parallel and coplanar.

17. The method of claim 16, wherein the fourth axis is substantially perpendicular to the first axis.

18. The method of claim 16, wherein the fourth, fifth, and sixth interferometers share a second beam splitter block.

19. The method of claim 16, further comprising moving the beam column or the movable stage an adjustment distance in a direction substantially parallel to the fourth axis and the fifth and sixth axes based on the calculation.

20. The method of claim 11, further comprising:
calculating a compensation vector in real-time based on the calculation; and
adjusting the position of the movable stage or the beam of the column based on the compensation vector.

* * * * *